(12) United States Patent
Su et al.

(10) Patent No.: US 11,211,367 B2
(45) Date of Patent: Dec. 28, 2021

(54) DISPLAY PANEL AND METHOD FOR FABRICATING THE SAME

(71) Applicant: Qisda Corporation, Taoyuan (TW)

(72) Inventors: Chih-Chieh Su, Hsinchu County (TW); Chen-Yang Hu, Taoyuan (TW); Rung-Guang Hu, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 16/826,325

(22) Filed: Mar. 23, 2020

(65) Prior Publication Data

US 2020/0312825 A1 Oct. 1, 2020

(30) Foreign Application Priority Data

Mar. 25, 2019 (TW) .................................. 108110345

(51) Int. Cl.
*H01L 25/13* (2006.01)
*H01L 33/62* (2010.01)
*H01L 23/498* (2006.01)

(52) U.S. Cl.
CPC ........ *H01L 25/13* (2013.01); *H01L 23/49838* (2013.01); *H01L 33/62* (2013.01); *H01L 2933/0066* (2013.01)

(58) Field of Classification Search
CPC ... H01L 25/13; H01L 33/62; H01L 23/49838; H01L 2933/0066; H01L 25/0753
See application file for complete search history.

(56) References Cited

U.S. PATENT DOCUMENTS

| | | | | |
|---|---|---|---|---|
| 10,950,685 | B2* | 3/2021 | Chen | H01L 27/3293 |
| 10,986,725 | B2* | 4/2021 | Chang | H05K 5/0017 |
| 2007/0164302 | A1* | 7/2007 | Tanda | H01L 33/486 |
| | | | | 257/98 |
| 2011/0175533 | A1* | 7/2011 | Holman | E04B 9/32 |
| | | | | 315/130 |
| 2016/0154262 | A1* | 6/2016 | Cho | G02F 1/13336 |
| | | | | 349/58 |
| 2016/0299370 | A1* | 10/2016 | Wu | G02F 1/1368 |
| 2017/0010638 | A1* | 1/2017 | Park | G06F 1/1637 |
| 2017/0148374 | A1* | 5/2017 | Lee | G09G 3/3648 |

(Continued)

FOREIGN PATENT DOCUMENTS

| | | |
|---|---|---|
| CN | 105044964 A | 11/2015 |
| CN | 206115896 U | 4/2017 |

(Continued)

OTHER PUBLICATIONS

Office action of counterpart application by SIPO on May 22, 2020.

(Continued)

*Primary Examiner* — Victor A Mandala (57) ABSTRACT

A display panel includes a first substrate used to connect with at least one other substrate, a plurality of first light-emitting elements and a first patterned conductive layer. The first substrate includes a first light output surface and a first sidewall connecting to the first light output surface, wherein the first sidewall forms a non-180° angle with the first light output surface. The plurality of first light-emitting elements are disposed on the first light output surface. The first patterned conductive layer is disposed on the first sidewall.

8 Claims, 6 Drawing Sheets

(56) References Cited

U.S. PATENT DOCUMENTS

2017/0346164 A1\* 11/2017 Kim .................. H01Q 1/48
2020/0295120 A1\*  9/2020 Bower ............... G06F 3/147
2020/0313055 A1\* 10/2020 Su .................... G09G 3/32

FOREIGN PATENT DOCUMENTS

| CN | 108597382 A | 9/2018 |
| CN | 109326226 A | 2/2019 |
| TW | 201319679 A | 5/2013 |
| TW | 201610948 A | 3/2016 |

OTHER PUBLICATIONS

Office action of counterpart application by Taiwan IP Office, dated Mar. 4, 2020.

\* cited by examiner

DISPLAY PANEL AND METHOD FOR FABRICATING THE SAME

This application claims the benefit of Taiwan application Serial No. 108110345, filed Mar. 25, 2019, the subject matter of which is incorporated herein by reference.

BACKGROUND

Technical Field

The disclosure in generally relates to a display apparatus and the method for fabricating the same, and more particularly to a display panel and the method for fabricating the same.

Description of the Related Art

With the advancement of technology, the display apparatus with higher quality and more functions, such as more comfortable, large size, high resolution, multi-frequency, digital painting, are required. Traditionally, in order to provide a larger size display, liquid crystal displays (LCDs) splicing technology has been provide to splice and combine a plurality of LCDs to form a single display screen. However, due to the technical limitation, substantially seamless splicing is hardly to be achieved, and visual perception of splicing seams cannot be thoroughly eliminated.

In comparison with LCDs, self-light-emitting displays (such as, micro-light-emitting diode (micro-LED) displays) that have advantages of self-luminous, low small size power consumption, high color saturation and high response speed and have been considered as one of the hot trends of next generation display technology. However, the micro-LED technology involves a mass transfer process which requiring to batch transfer a plurality of separated micro-LED dies from a carrier wafer onto a prepared receiving substrate. With the trend of size shrinkage in micro-LEDs, there may be a trade-off between manufacturing cost and efficiency. If a large number of micro-LED dies are transferred at one time, the transferring tools with extremely high precision (which may be more expensive) is required, and the process yield is difficult to increase; if only a small amount of micro-LED dies are transferred at each time, the processing time will be increased significantly, and the production capacity will be difficult to increase.

To solve this problem, the prior art has previously combined several small-sized micro-LED display panels into a larger-sized display panel by a splicing process. But no matter what type of spliced display panel is applied, the adverse effect in the visual perception due to the splicing seams is still inevitable.

Therefore, there is a need of providing an improved display panel and the method for fabricating the same to obviate the drawbacks encountered from the prior art.

SUMMARY

One aspect of the present disclosure is to provide a display panel, wherein the display panel includes a first substrate used to connect with at least one other substrate, a plurality of first light-emitting elements and a first patterned conductive layer. The first substrate includes a first light output surface and a first sidewall connecting to the first light output surface, wherein the first sidewall forms a non-180° angle with the first light output surface. The plurality of first light-emitting elements are disposed on the first light output surface. The first patterned conductive layer is disposed on the first sidewall.

Another aspect of the present disclosure is to provide a method for fabricating a display panel, wherein the method includes steps as follows: Firstly, a first substrate including a first light output surface and a first sidewall is provided, wherein the first sidewall connects to the first light output surface, and forms a non-180° angle with the first light output surface. Next, a plurality of first light-emitting elements are formed on the first light output surface. Subsequently, a first patterned conductive layer is formed on the first sidewall.

In accordance with the aforementioned embodiments of the present disclosure, a display panel and the method for fabricating the same are provided, in which a first substrate is firstly provided, a plurality of first light-emitting elements are then formed on a light output surface of the first substrate, and a first patterned conductive layer is formed on a first sidewall of the first substrate. Wherein the first sidewall connects to the first light output surface and forms a non-180° angle with the first light output surface. In one embodiment, the first substrate can be spliced with another second substrate having a similar structure, and by the connection of the first patterned conductive layer, at least one of the first light-emitting elements formed on the first substrate can be electrically connected to at least one of the second light-emitting elements formed on the second substrate. Such that image can be displayed by both of the first light-emitting elements and the second light-emitting elements in response to the image signal provided from a driving circuit located on the first substrate to achieve the purpose of expanding the size of the display panel.

In another embodiment, at least one third light-emitting element can be formed on the splicing seam of the first substrate and the second substrate, and the third light-emitting elements can be connected to a driving circuit located either on the first substrate or located on the second substrate by the first patterned conductive layer (and/or the second pattern conductive layer formed on the second substrate), thereby image can be displayed by the third light-emitting element together with the first light-emitting elements and the second light-emitting elements. The visual problems either caused by the splicing seams resulted from the splice of the first substrate and the second substrate or caused by the first patterned conductive layer disposed in the splicing seams can be improved by the light emitted from the at least one third light-emitting element. Meanwhile, the arrangement of the third light-emitting element can further widen the distance between the first sidewall of the first substrate (and/or the second sidewall of the second substrate) and the first light-emitting elements (second light-emitting elements) without affecting the visual perception of the spliced display panel, so as to provide a larger processing window for achieving the invention object of increasing process yield.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

The embodiments as illustrated below provide a display panel and the method for fabricating the same to solve the visual problems caused by the splicing seams, meanwhile to improve the process yield without affecting the visual perception of the display panel. The present disclosure will now be described more specifically with reference to the following embodiments and the accompanying drawings illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

Figure 1A:
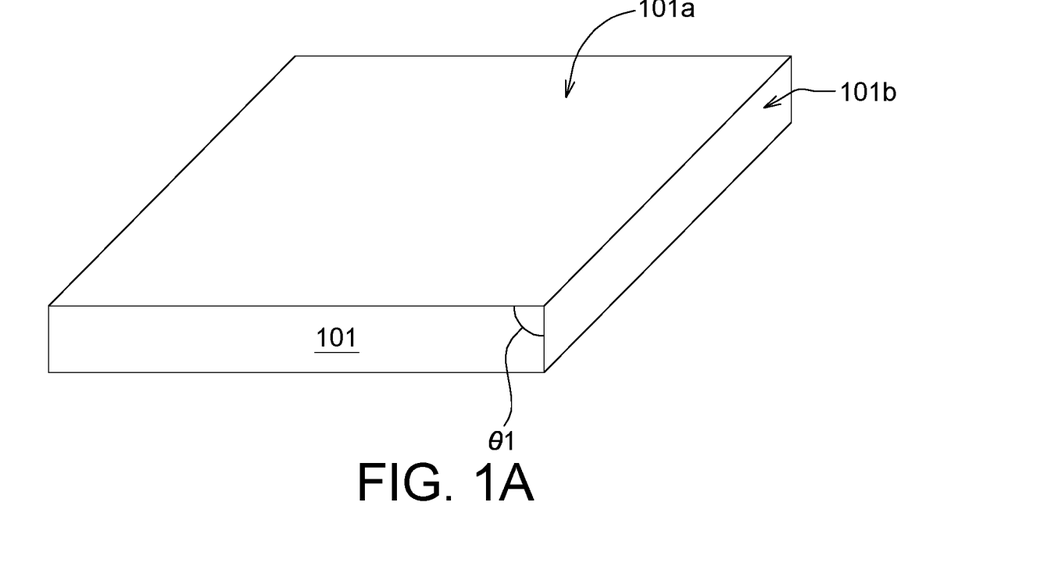
FIGS. 1A-1F are prospective views illustrating the processing structure for fabricating a display panel, in accordance with one embodiment of the present disclosure.

FIGS. 1A-1F are prospective views illustrating the processing structure for fabricating a display panel 100, in accordance with one embodiment of the present disclosure. The method for fabricating the display panel 100 includes steps as follows: Firstly, a first substrate 101 including a first light output surface 101a and a first sidewall 101b is provided, wherein the first sidewall 101b connects to the first light output surface 101a, and forms a non-180° angle Θ1 with the first light output surface 101a (as shown in FIG. 1A).

In some embodiments of the present disclosure, the first substrate 101 can be a light transmissive semiconductor substrate (for example, a germanium substrate), a glass substrate, a ceramic substrate, a flexible plasticized substrate (for example, a polyvinyl chloride (PVC) film), or other suitable material substrate. In the present embodiment, the first substrate 101 is a glass substrate.

Figure 1B:
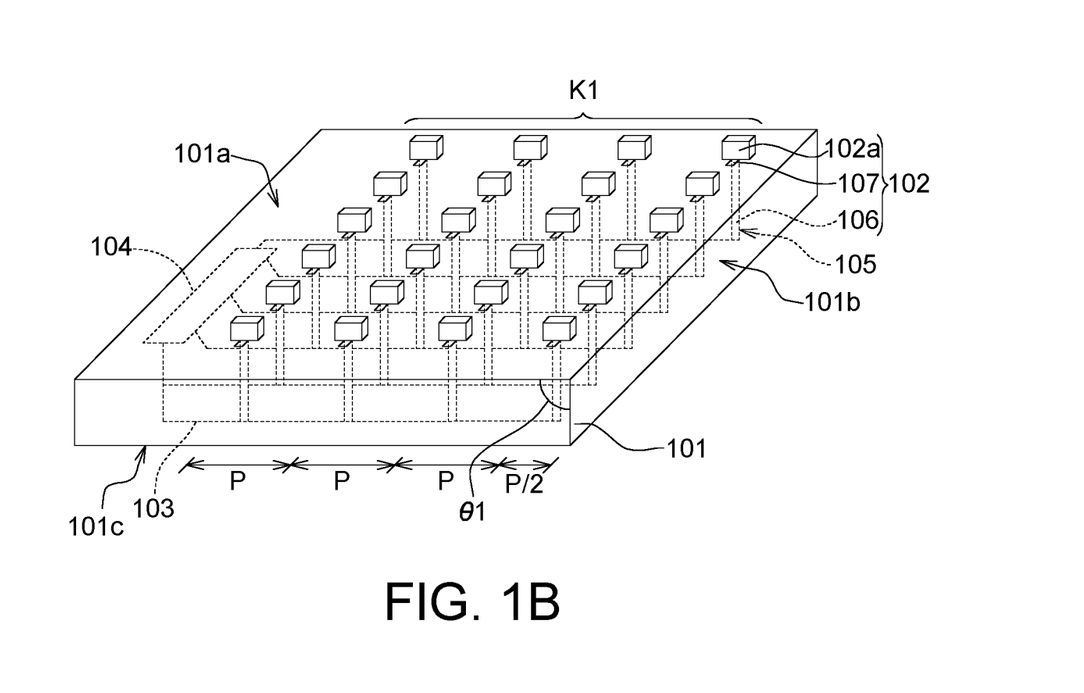

Next, a plurality of first light-emitting elements 102 are formed on the first light output surface 101a (as shown in FIG. 1B). In some embodiments of the present disclosure, the forming of the first light-emitting elements 102 includes steps as follows: First, a plurality of electroluminescence (EL) units (not shown) including at least one micro-LED are formed on an epitaxial substrate (not shown) by an epitaxial process The EL units are divided by a wafer dicing process to form a plurality of micro-LED dies 102a; the divided micro-LED dies 102a are transferred from the epitaxial substrate (not shown) to another temporary substrate (not shown) by a mechanical tool (not shown); and then are further transferred to the first substrate 101 from the temporary substrate. The material constituting the epitaxial substrate may be sapphire, silicon carbide (SiC), silicon (Si), zinc oxide (ZnO), magnesium oxide (MgO), aluminum nitride (AlN), gallium nitride (GaN) or a combination thereof.

In some embodiments of the present disclosure, after the micro-LED dies 102a are transferred to the first substrate 101, a first circuit 103 is formed on the first light output surface 101a or the opposite side 101c of the first light output surface 101a of the first substrate 101 to electrically connect to a driving circuit 104 located in the peripheral region of the first substrate 101. Each of the micro-LED dies 102a that are transferred to the first substrate 101 can be electrically connected to the first circuit 103 to form one of the first light-emitting elements 102. A plurality of the first light-emitting elements 102 can be arranged on the first light output surface 101a to form a pixel matrix K1; and each of the first light-emitting elements 102 can respectively respond to the image signal provided by the driving circuit 104 to either turn on or turn off for displaying images.

In the present embodiment, the first circuit 103 is formed on the opposite side 101c of the first light output surface 101a of the first substrate 101. The forming of the first circuit 103 further includes steps of forming a plurality of through holes 105 on the first light output surface 101a (For example, by drilling the glass substrates with thorough glass via (TGV) technology). A plurality of conductive plugs 106 are then formed by sputtering a conductive material (such as, copper (Cu), tungsten (W), aluminum (Al), gold (Au), silver (Ag) or any of the above alloys, metal oxides or other conductive materials) on the sidewall of each of the through holes 105 and electrically connected to the first circuit 103 respectively. Meanwhile, a plurality of bonding pads 107 are formed on the first light output surface 101a and electrically connected to the conductive plugs 106 respectively, so as to make each of the plurality of bonding pads 107 electrically connecting to the first circuit 103 through the corresponding conductive plugs 106.

Each of the micro-LED dies 102a that are transferred to the first substrate 101 can be landed on one of the bonding pads 107 and electrically connected to the first circuit 103 through the corresponding bonding pads 107 and the corresponding conductive plugs 106, thereby the electrical connection between the micro-LED dies 102a and the driving circuit 104 can be implemented. Each of the aforementioned first light-emitting elements 101 can be regarded as one pixel, and there is a pixel pitch P between each two adjacent pixels.

Figure 1C:
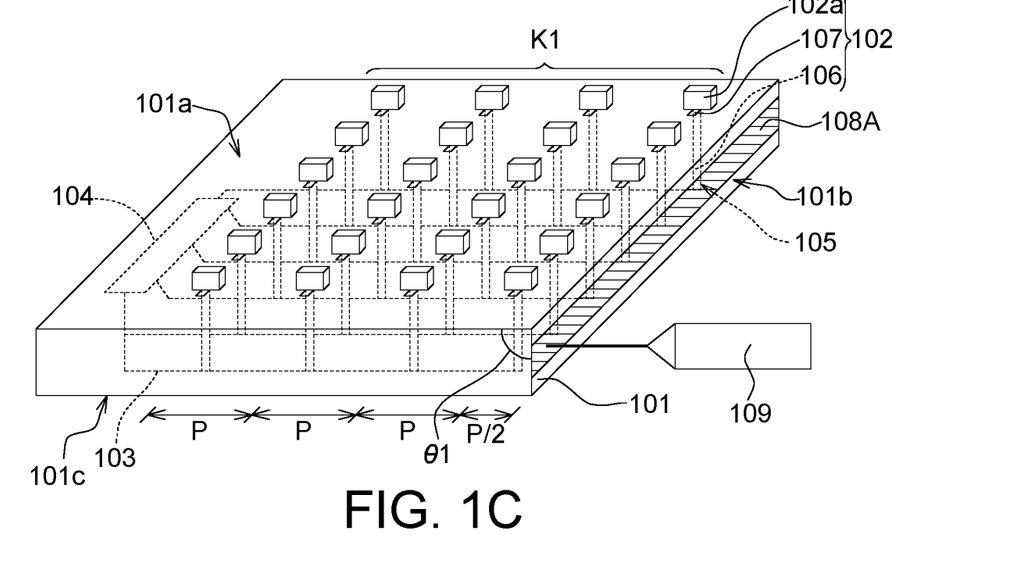
Figure 1D:
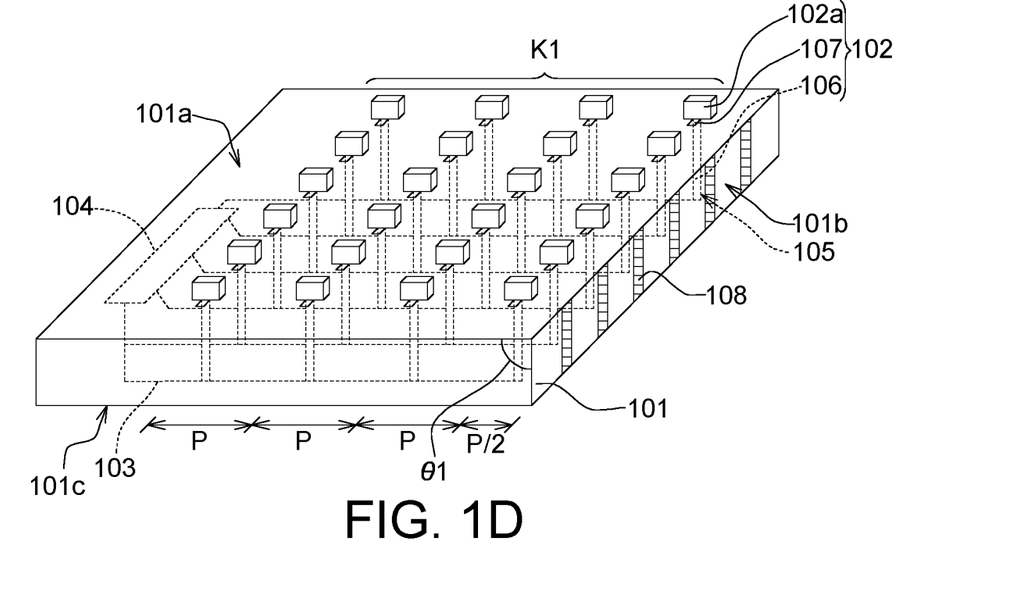

Subsequently, a first patterned conductive layer 108 is formed on the first sidewall 101b to make the first patterned conductive layer 108 electrically connected to the first circuit 103. In some embodiments of the present disclosure, the forming of the first patterned conductive layer 108 includes steps as follows: A conductive material layer 108A is formed on the first sidewall 101b (as shown in FIG. 1C). Thereafter, a portion of the conductive material layer 108A is removed (for example) by an etching process or a laser treatment 109, to form the first patterned conductive layer 108 electrically connected to the first circuit 103 (as shown in FIG. 1D).

Figure 2A:
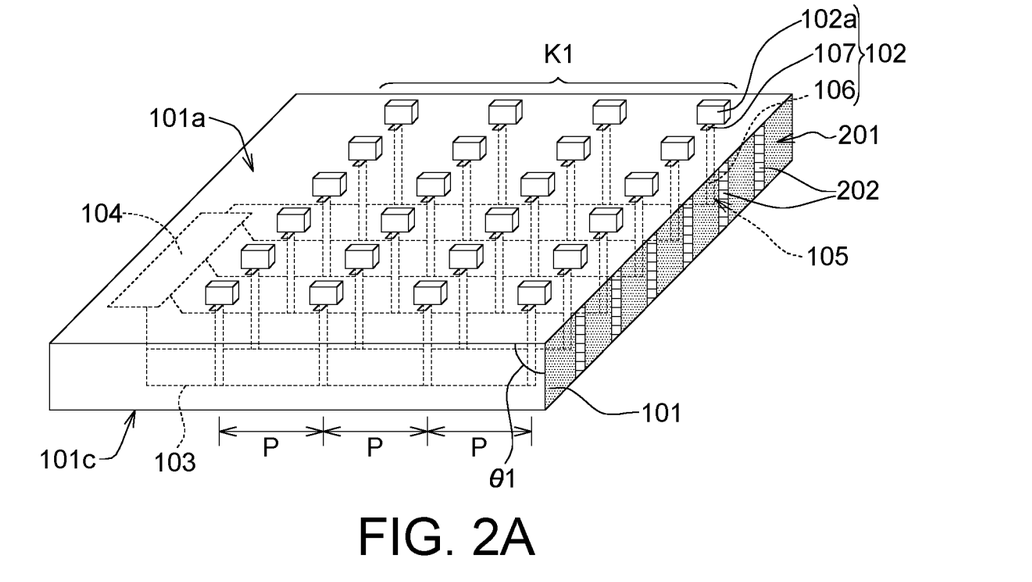
FIGS. 2A-2B are prospective views illustrating the processing structure for fabricating a first conductive layer of the display panel in accordance with another embodiment of the present disclosure.
Figure 2B:
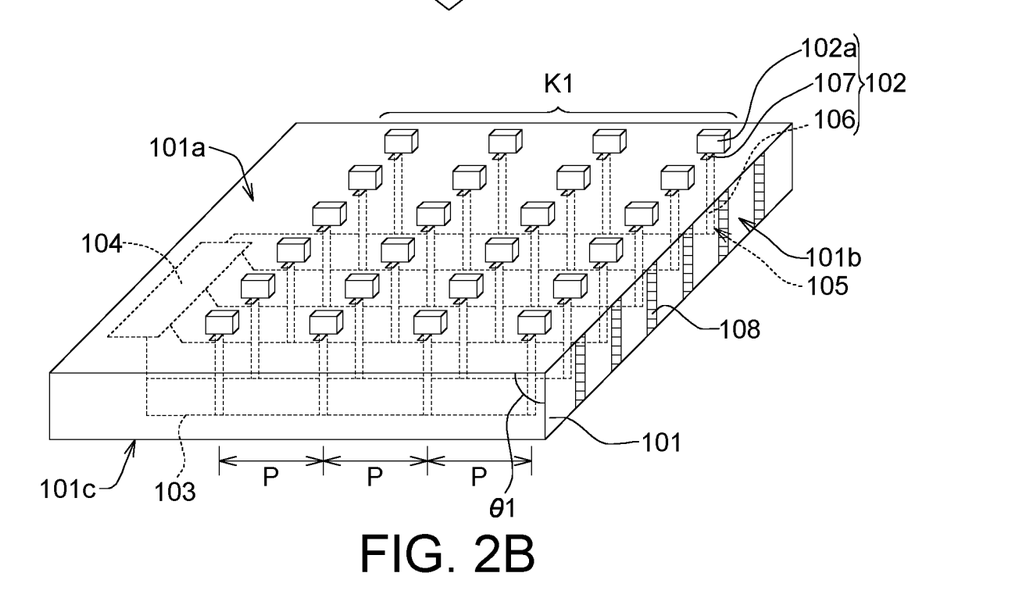

In some other embodiments of the present disclosure, the forming of the first patterned conductive layer 108 includes steps as follows: A patterned photoresist layer 201 is formed on the first sidewall 101b. A conductive material 202 is then deposited on the first sidewall 101b using the patterned photoresist layer 201 as a mask (see FIG. 2A). Thereafter, the patterned photoresist layer 201 is stripped to form the first patterned conductive layer 108 electrically connected to the first circuit 103 (see FIG. 2B).

Figure 1E:
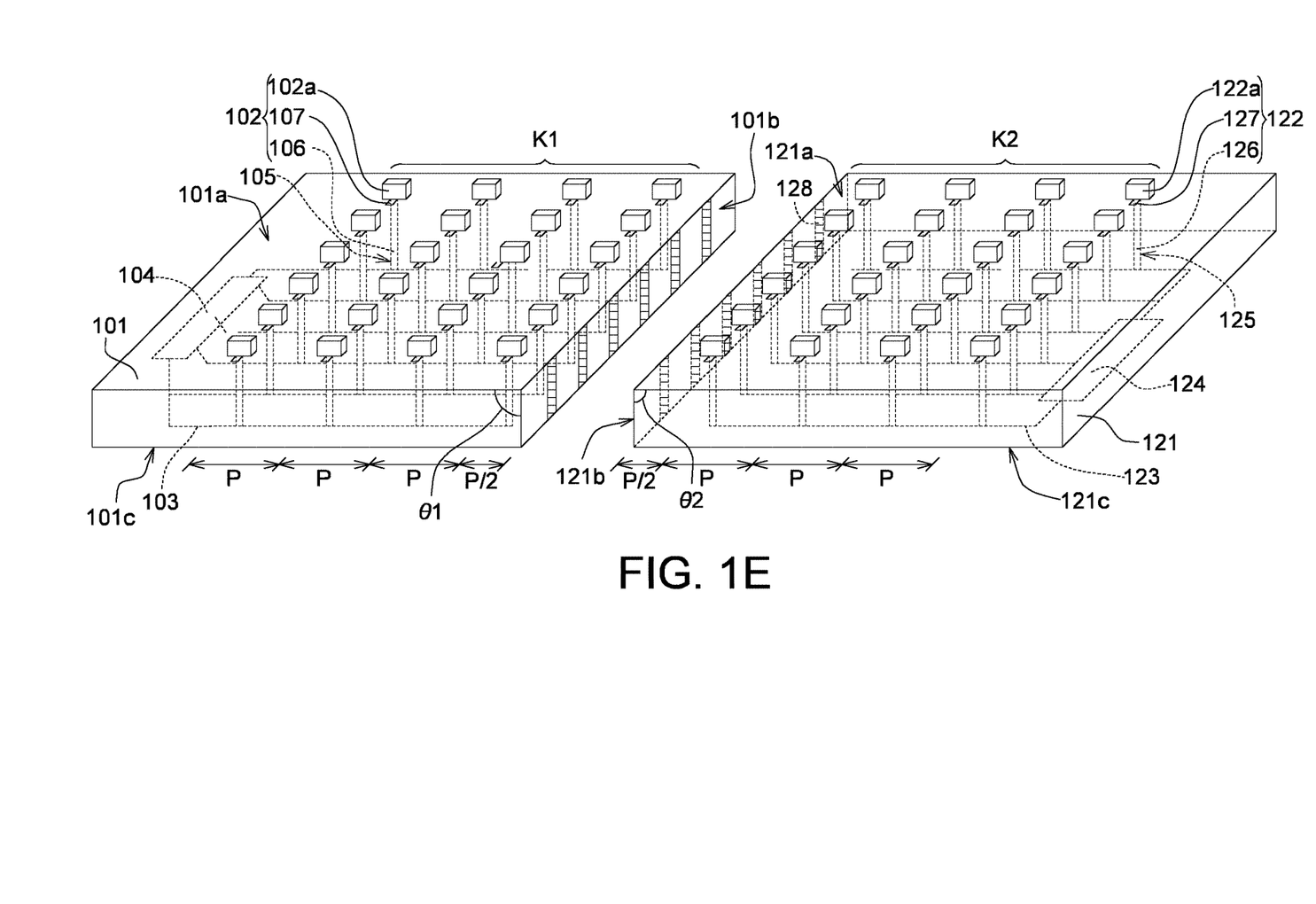

Next, in the same manner, a second substrate 121 is provided, and a plurality of second light-emitting elements 122 are formed on the second substrate 121. Wherein, the second substrate 121 has a second light output surface 121a and a second sidewall 121b connected to the second light output surface 121a, and the second light output surface 121a forms a non-180° angle θ2 with the second sidewall 121b. A second circuit 123 is formed on the second light output surface 121a or the opposite side 121c of the second light output surface 121a of the second substrate 121 to make the second circuit 123 electrically connecting to each of the second light-emitting elements 122; and a second patterned conductive layer 128 is formed on the second sidewall 121b to make the second patterned conductive layer 128 electrically connecting to the second circuit 123, by using the method described in FIGS. 1B-1D or FIGS. 2A-2B (as shown in FIG. 1E).

For example, in the present embodiment, the second circuit 123 is formed on the opposite side 121c of the second light output surface 121a. The second light output surface 121a further includes a plurality of through holes 125; and a conductive plug 126a is formed on sidewall of each of the through holes 125. In addition, each of the second light-emitting elements 122 can further include a bonding pad 127 and a micro-LED die 122a, wherein the bonding pad 127 is disposed on the second light output surface 121a and electrically connected to the second circuit 123 through the corresponding conductive plugs 126, respectively. Each of the micro-LED die 122a is landed on the corresponding bonding pad 127 and electrically connected to the second circuit 123 through the corresponding bonding pad 127 and the corresponding conductive plug 126. A plurality of the second light-emitting elements 122 can be arranged on the second light output surface 121a to form a pixel matrix K2; and there is a pixel pitch P between each two adjacent second light-emitting elements 122 (as shown in FIG. 1E).

Figure 1F:
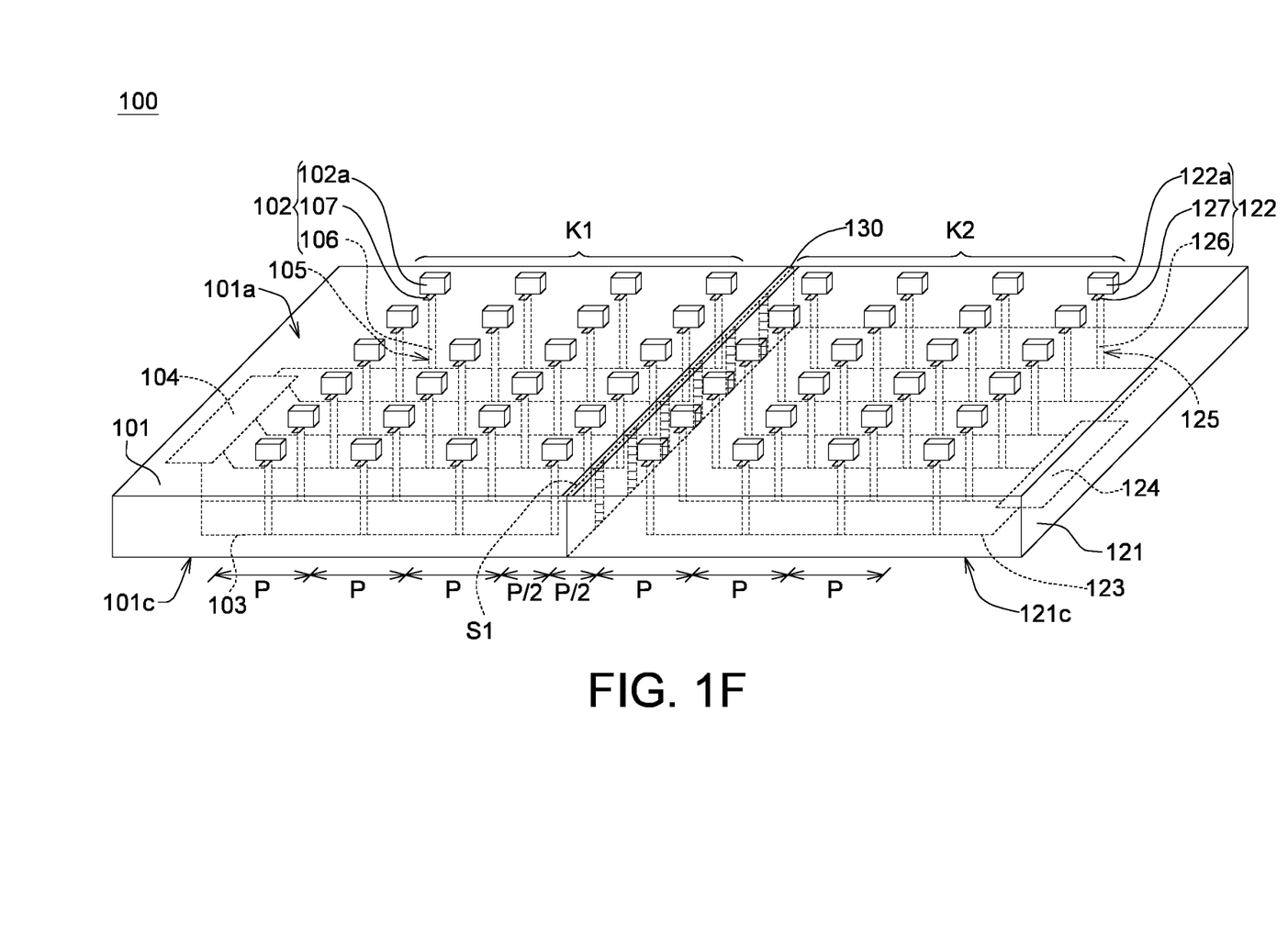

Subsequently, the first substrate 101 and the second substrate 121 are spliced, and a series of back-end processes (not shown) are then carried out to form the display panel 100 as shown in FIG. 1F. In the present embodiment, the first sidewall 101b of the first substrate 101 is in contact with the second sidewall 121b of the second substrate 121; and the second light output surface 121a is coplanar with the first light output surface 101a. The first patterned conductive layer 108 disposed on the first sidewall 101b of the first substrate 101 and the second patterned conductive layer 128 disposed on the second sidewall 121b of the second substrate 121 may match with each other and be in contact with each other. The second light-emitting elements 122 can be electrically connected to the driving circuit 104 through the first circuit 103 and the second circuit 123, and each of the second light-emitting elements 122 can respectively respond to the image signal provided by the driving circuit 104 to either turn on or turn off for displaying images.

However, the image display manners of the first light-emitting elements 102 and the second light-emitting elements 122 are not limited thereto. For example, in some other embodiments of the present disclosure, the display panel 100 may further include another driving circuit 124 disposed in a peripheral region of the second substrate 121 and electrically connected to the plurality of second light-emitting elements 122 through the second circuit 123. The first light-emitting elements 102 can also be connected to the driving circuit 124 disposed in the peripheral region of the second substrate 121 through the first circuit 103, the second circuit 123, the first patterned conductive layer 108, and the second patterned conductive layer 128; and each of the first light-emitting elements 102 and the second light-emitting elements 122 can respectively respond to the image signal provided by the driving circuit 124 to either turn on or turn off for displaying images. In still other embodiments of the present disclosure, each of the first light-emitting elements 102 can respectively display image in response to image signal provided by the driving circuit 104 disposed on the first substrate 101; and each of the second-lighting elements 122 can respectively display image in response to image signal provided by the driving circuit 124 disposed on the second substrate 121.

In order to reduce the visual difference between the spliced status and the initial status, before the first patterned conductive layer 108 and the second patterned conductive layer 128 are formed, the first substrate 101 and the second substrate 121 may be trimmed to make the distance between the first sidewall 101b and the row of the first light-emitting elements 102 in the pixel matrix K1 that is closest to the first sidewall 101b to be P/2, and to make the distance between the second sidewall 121b and the row of the second-lighting elements 122 in the pixel matrix K2 that is closest to the second sidewall 121b to be P/2. Such that, after the first substrate 101 and the second substrate 121 are spliced, the distance between the row of the first light-emitting elements 102 in the pixel matrix K1 that is closest to the splicing seam S1 and the row of the second-lighting elements 122 in the pixel matrix K2 that is closest to the splicing seam S1 can be maintained as P.

In the present embodiment, the connection line of the second light output surface 121a and the second sidewall 121b extends in a first direction, and the row extending direction of the second light-emitting elements 122 in the pixel matrix K2 is parallel or substantially parallel to the first direction. The connection line of the first light output surface 101a and the first sidewall 101b extends in a second direction, and the row extending direction of the first light-emitting elements 102 in the pixel matrix K1 is parallel or substantially parallel to the second direction. After the first substrate 101 and the second substrate 121 are spliced, the first direction is parallel to the second direction.

Since the distance between each adjacent two light-emitting elements (including each adjacent two first light-emitting elements 102 in the pixel matrix K1, each adjacent two second light-emitting elements 122 in the pixel matrix K2, and each pair of the adjacent first light-emitting element 102 and the second light-emitting element 122 respectively disposed on the rows of the pixel matrix K1 and the pixel matrix K2 that are closest to the splicing seam S1) is P, thus the image brightness and resolution of the display panel 100 would not be deteriorated by to the splicing of the first substrate 101 and the second substrate 121.

In addition, because the splicing seam S1 of the first substrate 101 and the second substrate 121 is still visible, after the first substrate 101 and the second substrate 121 are spliced. In some embodiments of the present disclosure, a black matrix 130 can be applied to cover the splicing seam S1 and shield the light reflected or refracted by the first patterned conductive layer 108 and/or the second patterned conductive layer 128. It should be appreciated that the second patterned conductive layer 128 may not be disposed on the second sidewall 121b, the technical purpose of the present invention can be still achieved, as long as the first sidewall 101b of the first substrate 101 used for splicing the second sidewall 121b has the second patterned conductive layer 128 formed thereon.

Figure 3:
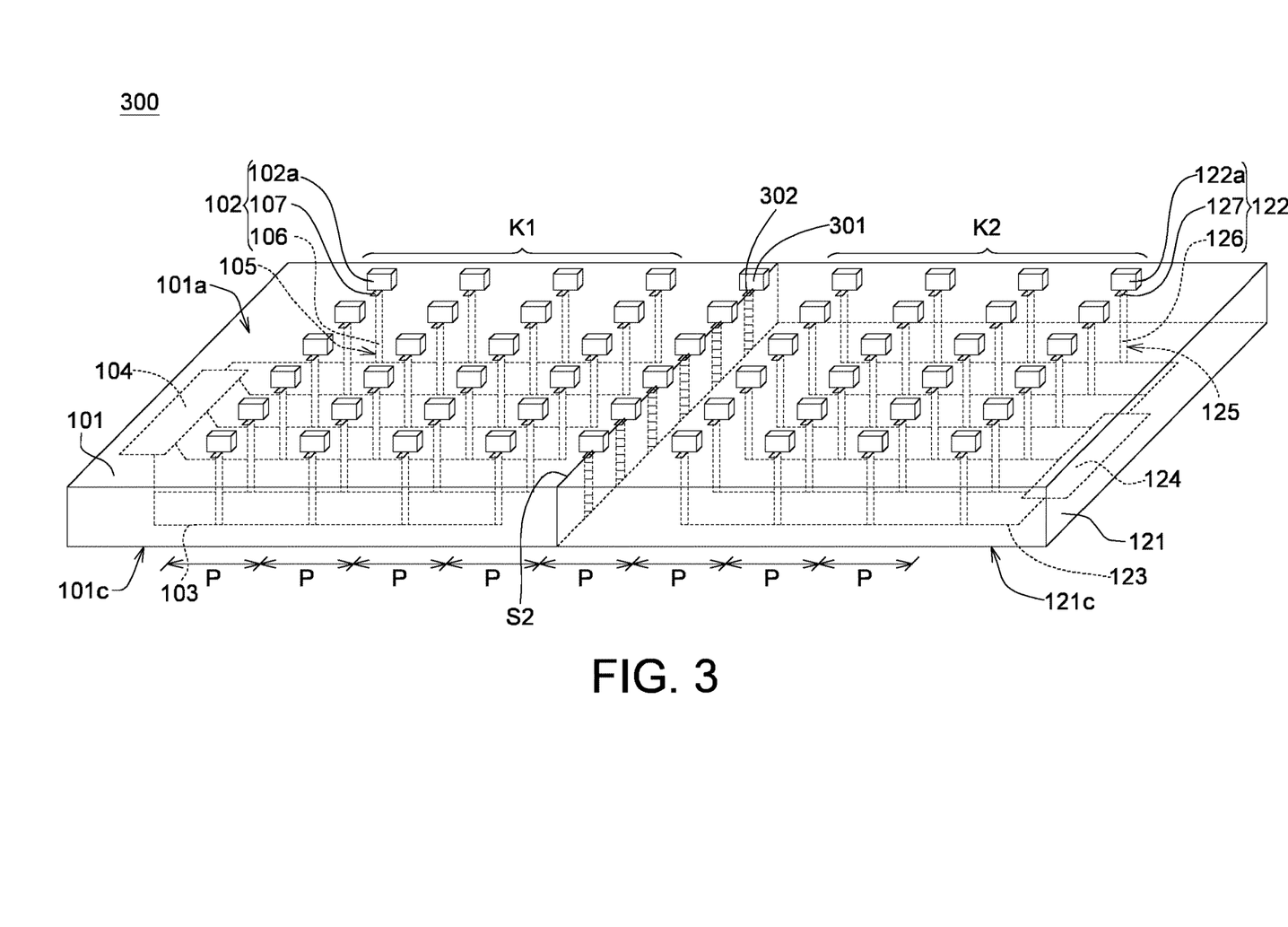
FIG. 3 is a simplified prospective view illustrating a display panel, according to yet another embodiment of the present disclosure.

FIG. 3 is a simplified prospective view illustrating a display panel 300, according to yet another embodiment of the present disclosure. The structure of the display panel 300 is substantially identical to that of the display panel 100 as depicted in FIG. 1D, except that the display panel 300 further includes a plurality of third light-emitting elements 301 disposed on the splicing seam S2 of the first substrate 101 and the second substrate 121 and electrically connected to at least one of the first light-emitting elements 102 (and/or at least one of the second light-emitting elements 122) through the first patterned conductive layer 108 (and/or the second patterned conductive layer 128).

The method for forming of the third light-emitting elements 301 can be identical to or different from that for forming of the first light-emitting elements 102 and the second light-emitting elements 122. In the present embodiment, the method for forming of the third light-emitting elements 301 is identical to that for forming of the first light-emitting elements 102 and the second light-emitting elements 122. In addition, the forming of the third light-emitting elements 301 further includes steps of transferring micro-LED dies onto a plurality of bonding pads 302 formed on the splicing seam S2 of the first substrate 101 and the second substrate 121 using transferring tools, after the first substrate 101 and the second substrate 121 are spliced.

In some embodiments of the present disclosure, the first patterned conductive layer 108 formed on the first sidewall 101b of the first substrate 101 can extend upwards to the splicing seam S2 to electrically connect the corresponding bonding pads 302 respectively, thereby the third light-emitting elements 301 can be electrically connect to the first circuit 103 through the first patterned conductive layer 108. As a result, each of the third light-emitting elements 301 can electrically connect to (eg. in series) a corresponding one of the first light-emitting elements 102 in the pixel matrix K1, meanwhile electrically connect to the driving circuit 104 through the first circuit 103; and respectively respond to the image signal provided by the driving circuit 104 to either turn on or turn off for displaying images.

Similarly, the second patterned conductive layer 128 formed on the second sidewall 121b of the second substrate 121 can extend upwards to the splicing seam S2 to electrically connect the corresponding bonding pads 302 respectively. As a result, each of the third light-emitting elements 301 can electrically connect to (eg. in series) a corresponding one of the second light-emitting elements 122 in the pixel matrix K2, meanwhile electrically connect to the driving circuit 124 through the second circuit 123; and respectively respond to the image signal provided by the driving circuit 124 to either turn on or turn off for displaying images.

Because the third light-emitting elements 301 are disposed on the splicing seam S2 of the first substrate 101 and the second substrate 121 and arranged in a single row, as long as the following conditions are satisfied, the adverse effect in the visual perception caused by the splicing of the first substrate 101 and the second substrate 121 can be obviated. The conditions includes that the distance between the row of the first light-emitting elements 102 in the pixel matrix K1 that is closest to the first sidewall 101b and the row of the third light-emitting elements 301 is maintained as P; and the distance between the row of the second-lighting elements 122 in the pixel matrix K2 that is closest to the second sidewall 121b and the row of the third light-emitting elements 301 is maintained as P.

Also, during the process for fabricating the display panel 300, since the distance between the pixel matrix K1 and the first side wall 101b as well as the distance between the pixel matrix K2 and the second side wall 121b are increased, thus a larger process window for trimming the first substrate 101 and the second substrate 121 can be provided. Particularly, in the case where the pixel density of the pixel matrices K1 and K2 is getting larger and larger, and the pixel pitch is more and more miniaturized, the process yield of the display panel 300 can be further improved.

In accordance with the aforementioned embodiments of the present disclosure, a display panel and the method for fabricating the same are provided, in which a first substrate is firstly provided, a plurality of first light-emitting elements are then formed on a light output surface of the first substrate, and a first patterned conductive layer is formed on a first sidewall of the first substrate. Wherein the first sidewall connects to the first light output surface and forms a non-180° angle with the first light output surface. In one embodiment, the first substrate can be spliced with another second substrate having a similar structure, and by the connection of the first patterned conductive layer, at least one of the first light-emitting elements formed on the first substrate can be electrically connected to at least one of the second light-emitting elements formed on the second substrate. Such that image can be displayed by both of the first light-emitting elements and the second light-emitting elements in response to the image signal provided from a driving circuit located on the first substrate to achieve the purpose of expanding the size of the display panel.

In another embodiment, at least one third light-emitting element can be formed on the splicing seam of the first substrate and the second substrate, and the third light-emitting elements can be connected to a driving circuit located either on the first substrate or located on the second substrate by the first patterned conductive layer (and/or the second pattern conductive layer formed on the second substrate), thereby image can be displayed by the third light-emitting element together with the first light-emitting elements and the second light-emitting elements. The visual problems either caused by the splicing seams resulted from the splice of the first substrate and the second substrate or caused by the first patterned conductive layer disposed in the splicing seams can be improved by the light emitted from the at least one third light-emitting element. Meanwhile, the arrangement of the third light-emitting element can further widen the distance between the first sidewall of the first substrate (and/or the second sidewall of the second substrate) and the first light-emitting elements (second light-emitting elements) without affecting the visual perception of the spliced display panel, so as to provide a larger processing window for achieving the invention object of increasing process yield.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display panel, comprising:
  a first substrate used to connect with at least one other substrate, wherein the first substrate comprises a first light output surface and a first sidewall connecting to the first light output surface; and the first sidewall forms a non-180° angle with the first light output surface; wherein the at least one other substrate comprises a second substrate comprising a second light output surface and a second sidewall connected to the second light output surface; the first sidewall is in contact with the second sidewall; and the first light output surface is coplanar with the second light output surface;

a plurality of first light-emitting elements, disposed on the first light output surface;

a plurality of second light-emitting elements, disposed on the second light output surface;

a first patterned conductive layer, disposed on the first sidewall;

a first circuit formed on the first light output surface or an opposite side of the first light output surface to electrically connect to the first patterned conductive layer; and a second circuit formed on the second light output surface or an opposite side of the second light output surface to electrically connect to the first patterned conductive layer.

2. The display panel according to claim 1, further comprising a second patterned conductive layer, disposed on the second sidewall.

3. The display panel according to claim 1, further comprising a first driving circuit electrically connecting to the first light-emitting elements through the first circuit and the first patterned conductive layer.

4. The display panel according to claim 1, further comprising a second driving circuit electrically connecting to the second light-emitting elements through the second circuit and the second patterned conductive layer.

5. A display panel, comprising:
a first substrate used to connect with at least one other substrate, wherein the first substrate comprises a first light output surface and a first sidewall connecting to the first light output surface; and the first sidewall forms a non–180° angle with the first light output surface; wherein the at least one other substrate comprises a second substrate comprising a second light output surface and a second sidewall connected to the second light output surface; the first sidewall is in contact with the second sidewall; and the first light output surface is coplanar with the second light output surface;

a plurality of first light-emitting elements, disposed on the first light output surface;

a plurality of second light-emitting elements, disposed on the second light output surface;

a first patterned conductive layer, disposed on the first sidewall;

a plurality of third light-emitting elements disposed on a splicing seam of the first light output surface and the second light output surface and electrically connected to at least one of the first light-emitting elements through the first patterned conductive layer.

6. The display panel according to claim 5, wherein each two adjacent ones of the first light-emitting elements have a pitch; each two adjacent ones of the second light-emitting elements have the pitch; each of the third light-emitting elements and an adjacent one of the first light-emitting elements have the pitch; and each of the third light-emitting elements and an adjacent one of the second light-emitting elements have the pitch.

7. The display panel according to claim 5, further comprising a black matrix covering the splicing seam.

8. The display panel according to claim 5, further comprising a plurality of bonding pads formed on the splicing seam and electrically connected to the first patterned conductive layer.

* * * * *